United States Patent
Specht et al.

(10) Patent No.: US 7,528,425 B2
(45) Date of Patent: May 5, 2009

(54) SEMICONDUCTOR MEMORY WITH CHARGE-TRAPPING STACK ARRANGEMENT

(75) Inventors: Michael Specht, Munich (DE); Wolfgang Roesner, Ottobrunn (DE); Franz Hofmann, Munich (DE)

(73) Assignee: Infineon Technologies AG, Munich (DE)

( * ) Notice: Subject to any disclaimer, the term of this patent is extended or adjusted under 35 U.S.C. 154(b) by 461 days.

(21) Appl. No.: 11/193,026

(22) Filed: Jul. 29, 2005

(65) Prior Publication Data

US 2007/0023808 A1   Feb. 1, 2007

(51) Int. Cl.
*H01L 29/792* (2006.01)

(52) U.S. Cl. .............. 257/261; 257/260; 257/314; 257/E29.309; 257/E21.18; 257/E21.21; 257/E21.68; 257/E21.423; 257/E21.679

(58) Field of Classification Search .......... 257/260, 257/261, 314, E29.309, E21.18, E21.21, 257/E21.68, E21.423, E21.679
See application file for complete search history.

(56) References Cited

U.S. PATENT DOCUMENTS

| 5,937,295 A | 8/1999 | Chen et al. |
| 6,091,101 A | 7/2000 | Wang |
| 6,333,214 B1 | 12/2001 | Kim et al. |

(Continued)

FOREIGN PATENT DOCUMENTS

DE   10 2004 055 929 A1   6/2006

OTHER PUBLICATIONS

Eitan, B., et al., "NROM: A Novel Localized Trapping, 2-Bit Non-volatile Memory Cell," IEEE Electron Device Letters, vol. 21, No. 11 (Nov. 2000) pp. 543-545.

Lee, Y.K., et al., "Twin SONOS Memory with 30-nm Storage Nodes Under a Merged Gate Fabricated with Inverted Sidewall and Damascene Process," IEEE Electron Device Letters, vol. 25, No. 5 (May 2004) pp. 317-319.

(Continued)

*Primary Examiner*—Thanh V Pham
(74) *Attorney, Agent, or Firm*—Slater & Matsil, L.L.P.

(57) ABSTRACT

A semiconductor memory having a multitude of memory cells (21-1), the semiconductor memory having a substrate (1), at least one wordline (5-1), a first (15-1) and a second line (15-2; 16-1), wherein each of the multitude of memory cells (21-1) comprises a first doping region (6) disposed in the substrate (1), a second doping region (7) disposed in the substrate (1), a channel region (22) disposed in the substrate (1) between the first doping region (6) and the second doping region (7), a charge-trapping layer stack (2) disposed on the substrate (1), on the channel region (22), on a portion of the first doping region (6) and on a portion of the second doping region (7). Each memory cell (21-1) further comprises a conductive layer (3) disposed on the charge-trapping layer stack (2), wherein the conductive layer (3) is electrically floating. A dielectric layer (4) is disposed on a top surface of the conductive layer (3) and on sidewalls (23) of the conductive layer (3). The first line (15-1) extends along a first direction and is coupled to the first doping region (6), and the second line (15-2; 16-1) extends along the first direction and is coupled to the second doping region (7). The at least one wordline (5-1) extends along a second direction and is disposed on the dielectric layer (4).

24 Claims, 8 Drawing Sheets

U.S. PATENT DOCUMENTS

| | | | |
|---|---|---|---|
| 6,501,681 B1* | 12/2002 | Van Buskirk et al. | 365/185.22 |
| 6,512,263 B1* | 1/2003 | Yuan et al. | 257/316 |
| 6,872,614 B2 | 3/2005 | Fujiwara | |
| 7,000,349 B2* | 2/2006 | Weder | 47/72 |
| 2004/0197995 A1 | 10/2004 | Lee et al. | |
| 2005/0035393 A1* | 2/2005 | Lung et al. | 257/314 |
| 2005/0064654 A1* | 3/2005 | Caprara et al. | 438/232 |
| 2005/0085037 A1* | 4/2005 | Kleint et al. | 438/253 |
| 2005/0104117 A1* | 5/2005 | Mikolajick et al. | 257/315 |
| 2005/0164456 A1* | 7/2005 | Deppe et al. | 438/275 |

OTHER PUBLICATIONS

Park, J.-H., et al., "8Gb MLC (Multi-Level Cell) NAND Flash Memory using 63nm Process Technology," IEDM (2004) pp. 873-876.

* cited by examiner

SEMICONDUCTOR MEMORY WITH CHARGE-TRAPPING STACK ARRANGEMENT

TECHNICAL FIELD

The present invention relates generally to semiconductor memory devices and more particularly to flash memories.

BACKGROUND

In the field of high density non-volatile data storage the floating gate technology based NAND array architecture is an important factor, in particular due to the simplicity of the production process, low costs per bit, especially when implementing multilevel storage techniques, and good scalability of the process for devices having a minimal feature size F above 50 nm. However, for devices having a minimal feature size F below 50 nm, significant difficulties regarding the production process are expected due to increasing interaction between the floating gates of adjacent memory cells, degraded controllability of the gate of the floating gate transistor, punch-through during reading and programming as well as low read currents. An alternative to the floating gate technology is the NROM technology, which provides a capacity for digital data storage of two bits/cell and the $3F^2$/bit virtual ground architecture. However, the scalability below a minimal feature size F of 50 nm of this technique is questionable due to the presence of high electrical fields between source and drain during operation. An expansion of the digital data storage capacity for two bits/cell to four bits/cell by providing four different states at each of the pn-junctions is difficult due to the "second bit effect," that refers to a cross talk of the second bit. Furthermore, the scalability of the NROM-transistor is delimited when the ONO trapping layer has a large effective oxide thickness (EOT).

What is desired is a memory, a process for the fabrication of such a memory and a for operating such a memory, wherein the memory has the functionality of an NROM wherein the dimensions of a memory cell of the memory can be scaled down to a minimum feature size F below 50 nm.

SUMMARY OF THE INVENTION

One embodiment of the present invention provides a semiconductor memory that has a multitude of memory cells. The semiconductor memory has a substrate, at least one wordline, a first and a second line. The first and second line have the functionality of a first and a second bitline, respectively, of the semiconductor memory. Each memory cell of the multitude of memory cells comprises a first doping region disposed in the substrate and a second doping region disposed in the substrate. A channel region is disposed in the substrate between the first doping region and the second doping region. The first doping region and the second doping region each are a source and a drain of a transistor of the semiconductor memory. The first doping region may be the source and the second doping region may be the drain of the transistor. Alternatively, the first doping region may be the drain of the transistor and the second doping region may be the source of the transistor. A charge-trapping layer stack is disposed on the substrate, the charge-trapping layer stack covering the channel region, a portion of the first doping region and a portion of the second doping region. A conductive layer is disposed on the charge-trapping layer stack, wherein the conductive layer is electrically floating. The conductive layer can be a floating gate. A dielectric layer is disposed on a top surface of the conductive layer and on sidewalls of the conductive layer. The first line extends along a first direction and is coupled to the first doping region. The second line extends along the second direction and is coupled to the second doping region. The at least one wordline extends along a second direction and is disposed on the dielectric layer. The wordline is a control gate of the memory cell.

In another embodiment, the charge-trapping layer stack is formed as a continuous layer laterally extending beyond the memory cell to at least two further memory cells of the semiconductor memory. The conductive layer is disposed on a portion of the charge-trapping layer stack, wherein the portion of the charge-trapping layer stack covers the channel region and the portion of the first doping region and the portion of the second doping region. The dielectric layer is disposed on the top surface and on the sidewalls of the conductive layer and on other portions of the charge-trapping layer stack, wherein the other portions of the charge-trapping layer stack are located between conductive layers of memory cells adjacent to one another.

In another embodiment, the dielectric layer extends into recesses between conductive layers of memory cells adjacent to one another.

In another embodiment, the wordline extends into the recesses and covers the dielectric layer in the recesses.

In another embodiment, the charge-trapping layer stack is provided between the wordline and the substrate. The charge-trapping layer stack is in contact with the substrate and the conductive layer and with portions of the dielectric layer located between conductive layers of memory cells adjacent to one another.

The conductive layer may comprise one of n-doped polysilicon, p-doped polysilicon or a metal. The metal comprises at least one metal of the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr.

The wordline may comprise one of n-doped polysilicon, p-doped polysilicon or a metal. The metal comprises at least one metal of the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr.

The charge-trapping layer stack may comprise a material selected from the group consisting of silicon oxide, silicon nitride, hafnium oxide, aluminum oxide and hafnium silicate. The charge-trapping layer stack may comprise a material having a dielectric constant of at least 3.9.

In another embodiment, the charge-trapping layer stack comprises a first dielectric layer disposed on the substrate, a second dielectric layer disposed on the first dielectric layer and a third dielectric layer disposed on the second dielectric layer.

In another embodiment, the first and third dielectric layers of the charge-trapping layer stack each comprise a material selected from the group consisting of silicon oxide and hafnium silicate. The second dielectric layer of the charge-trapping layer stack comprises a material selected from the group consisting of silicon nitride, hafnium oxide and aluminum oxide.

In another embodiment, the first, the second and the third dielectric layers of the charge-trapping layer stack each comprise a material having a dielectric constant of at least 3.9.

In another embodiment, the first dielectric layer of the charge-trapping layer stack has a thickness of between about 4 nm and 6 nm, preferably about 5 nm. The second dielectric layer of the charge-trapping layer stack has a thickness of between about 4 nm and 6 nm, preferably about 5 nm. The third dielectric layer of the charge-trapping layer stack has a thickness of between about 5 nm and 7 nm, preferably about 6 nm.

In another embodiment, the dielectric layer comprises a material selected from the group consisting of silicon oxide, silicon nitride, hafnium oxide, aluminum oxide and hafnium silicate.

In another embodiment, the dielectric layer comprises a material having a dielectric constant of at least 3.9.

In another embodiment, the semiconductor memory further comprises trenches filled with trench isolation fillings, the trenches being disposed in the substrate and laterally confining the charge-trapping layer stack. The trenches separate channel regions of the memory cells.

In another embodiment, the dielectric layer is located on the top surface and the sidewalls of the conductive layer and on the trench isolation fillings. The dielectric layer extends into recesses between conductive layers of memory cells adjacent to one another. The wordline extends into the recesses and is disposed on the dielectric layer in the recesses. The dielectric layer is provided between the wordline and the trench isolation filling, and the dielectric layer is in contact with the wordline and the trench isolation filling and the conductive layer.

In another embodiment, the dielectric layer comprises a portion disposed on the top surface of the conductive layer and further portions disposed on the sidewalls of the conductive layer, the portions disposed on the top surface of the conductive layer being thicker than the further portions disposed on the sidewalls of the conductive layer.

The portion disposed on the top surface of the conductive layer may be at least ten times thicker than the further portions disposed on the sidewalls of the conductive layer.

The portion of the dielectric layer disposed on the top surface of the conductive layer may comprise a thermal oxide layer. The further portions of the dielectric layer disposed on the sidewalls of the conductive layer may comprise a native oxide layer.

In another embodiment, the dielectric layer comprises a first dielectric layer in contact with the conductive layer, a second dielectric layer disposed on the first dielectric layer of the dielectric layer and a third dielectric layer disposed on the second dielectric of the dielectric layer.

The first, the second and the third dielectric layer of the dielectric layers may each comprise a material selected from the group consisting of silicon oxide, silicon nitride, hafnium oxide, aluminum oxide and hafnium silicate.

In another embodiment, the first, the second and the third dielectric layers of the dielectric layer may each comprise a material having a dielectric constant of at least 3.9.

In another embodiment, the first dielectric layer of the dielectric layer has a thickness of between about 3 nm and 5 nm, preferably about 4 nm. The second dielectric layer of the dielectric layer has a thickness of between about 4 nm and 6 nm, preferably about 5 nm. The third dielectric layer of the dielectric layer has a thickness of between about 4 nm and 6 nm, preferably about 5 nm.

In another embodiment, the first dielectric layer of the dielectric layer comprises a portion located on the top surface of the conductive layer and further portions located on the sidewalls of the conductive layer, wherein the portion located on the top surface of the conductive layer is thicker than the further portions located on the sidewalls of the conductive layer.

The portion of the first dielectric of the dielectric layer located on the top surface of the conductive layer may be a thermal oxide. The further portions of the first dielectric layer located on the sidewalls of the conductive layer may be native oxide layers. The portion of the first dielectric layer located on the top surface of the conductive layer may be at least ten times thicker than the further portions of the first dielectric layer located on the sidewalls of the conductive layer.

The further portions of the first dielectric layer located on the sidewalls of the conductive layer may have a thickness of below 2 nm, preferably about 1 nm. The second dielectric layer may have a thickness of below 2 nm, preferably about 1 nm.

In another embodiment, the second dielectric layer of the charge-trapping layer stack comprises a first section and a second section, wherein a portion of the third dielectric layer is disposed between the first section and the second section of the second dielectric layer.

In another embodiment, the first line is a line-shaped first doping area in the substrate, wherein the first doping area extends along the first direction and comprises the first doping region. The second line is a line-shaped second doping area in the substrate, wherein the second doping area extends along the first direction and comprises the second doping region.

In another embodiment, the semiconductor memory further comprises a first and a second metal line, the first and the second metal line extending along the first direction and being located at a distance from a top surface of the substrate. The semiconductor memory further comprises at least four conductive plugs, a first conductive plug coupling the first line to the first metal line, and a second conductive plug coupling the first line to the first metal line, wherein at least three wordlines are disposed between the first and the second conductive plugs. The semiconductor memory further comprises a third conductive plug coupling the second line to the second metal line and a fourth conductive plug coupling the second line to the second metal line, wherein at least three wordlines are disposed between the third and the fourth conductive plugs.

In another embodiment, the semiconductor memory further comprises a further memory cell being connected to the second line and to the wordline and to a third line, the third line extending along the second direction. The third line may be a third bitline of the semiconductor memory.

In another embodiment, the semiconductor memory further comprises a first wiring layer and a second wiring layer, wherein the first wiring layer is located at a distance from a top surface of the substrate, wherein the second wiring layer is located between the first wiring layer and the top surface of the substrate, wherein the first line is disposed in the first wiring layer, and wherein the second line is disposed in the second wiring layer.

In another embodiment, the semiconductor memory further comprises a first conductive plug, the first conductive plug coupling the first line to the first doping region. The semiconductor memory further comprises a second conductive plug, the second conductive plug coupling the second line to the second doping region.

In another embodiment, the semiconductor memory further comprises a further memory cell, a third line and a fourth line, wherein the third line and the fourth line extend along the first direction, the further memory cell being coupled to the wordline and to the third line and the fourth line. The third line may be a third bitline of the semiconductor memory and the fourth line may be a fourth bitline of the semiconductor memory.

Another aspect of the present invention provides a method of forming a semiconductor memory. The method comprises providing a substrate, forming at least one memory cell, wherein forming the at least one memory cell includes forming a first doping region in the substrate and forming a second doping region in the substrate, wherein the first and the second doping regions are separated from one another by a channel region. The method further comprises forming a charge-trapping layer stack on the substrate, the charge-trapping layer stack covering at least a portion of the first doping region, at least a portion of the second doping region and at least a portion of the channel region. The method further comprises forming a patterned conductive layer on the charge-trapping layer stack. The method further comprises forming a dielectric layer on a top surface of the conductive layer and on sidewalls of the conductive layer, forming a first line along a first direction, wherein the first line is coupled to the first doping region, and forming a second line along the first direction, wherein the second line is coupled to the second doping region. The method further comprises forming a wordline along a second direction, wherein a portion of the wordline is disposed on the dielectric layer.

In another embodiment, forming the dielectric layer includes forming the dielectric layer on portions of the charge-trapping layer stack, the portions being located between conductive layers of memory cells adjacent to one another. In another embodiment, forming the dielectric layer includes depositing the dielectric layer into recesses between conductive layers of memory cells adjacent to one another.

In another embodiment, forming the wordline includes forming the wordline extending into the recesses and covering the dielectric layer in the recesses.

In another embodiment, the conductive layer comprises one of n-doped polysilicon, p-doped polysilicon or a metal. The metal may be selected from the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr.

In another embodiment, the wordline comprises one of n-doped polysilicon, p-doped polysilicon or a metal. The metal may be selected from the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr.

In another embodiment, the charge-trapping layer stack comprises a material selected from the group consisting of silicon oxide, silicon nitride, hafnium oxide, aluminum oxide and hafnium silicate.

In another embodiment, a charge-trapping layer stack comprising a material having a dielectric constant of at least 3.9 is formed.

In another embodiment, forming the charge-trapping layer stack includes forming a first dielectric layer on the substrate, forming a second dielectric layer on the first dielectric layer and forming a third dielectric layer on the second dielectric layer.

In another embodiment, the first and the third dielectric layers of the charge-trapping layer stack each comprise a material selected from the group consisting of silicon oxide and hafnium silicate and the second dielectric layer of the charge-trapping layer stack comprises a material selected from the group consisting of silicon nitride, hafnium oxide and aluminum oxide.

In another embodiment, the first, the second and the third dielectric layers of the charge-trapping layer stack each comprise a material having a dielectric constant of at least 3.9.

In another embodiment, forming the first dielectric layer of the charge-trapping layer stack includes forming the first dielectric layer having a thickness of between about 4 nm and 6 nm, preferably about 5 nm. In another embodiment, forming the second dielectric layer of the charge-trapping layer stack includes forming the second dielectric layer having a thickness of between about 4 nm and 6 nm, preferably about 5 nm.

In another embodiment, forming the third dielectric layer of the charge-trapping layer stack includes forming the third dielectric layer having a thickness of between about 5 nm and 7 nm, preferably about 6 nm.

In another embodiment, forming the dielectric layer includes forming the dielectric layer comprising a material selected from the group consisting of silicon oxide, silicon nitride, hafnium oxide, aluminum oxide and hafnium silicate.

In another embodiment, forming the dielectric layer includes forming the dielectric layer comprising a material having a dielectric constant of at least 3.9.

In another embodiment, the method further comprises forming trenches in the substrate and the charge-trapping layer stack between channel regions of memory cells adjacent to one another and filling the trenches with trench isolation filling.

In another embodiment, forming the dielectric layer includes forming the dielectric layer on the top surface and on the sidewalls of the conductive layer and on the trench isolation fillings.

In another embodiment, forming the dielectric layer includes depositing the dielectric layer into recesses between conductive layers of memory cells adjacent to one another.

In another embodiment, a wordline extending into the recesses and covering the dielectric layer in the recesses is formed.

In another embodiment, forming the dielectric layer includes forming a portion of the dielectric layer on the top surface of the conductive layer, the portion having a first thickness and forming further portions of the dielectric layer on the sidewalls of the conductive layer, the further portions having a second thickness, wherein the first thickness is larger than the second thickness.

In another embodiment, the first thickness is at least ten times larger than the second thickness.

In another embodiment, the portion of the dielectric layer on the top surface of the conductive layer includes a thermal oxide layer. The further portions of the dielectric layer on the sidewalls of the conductive layer are native oxide layers.

In another embodiment, forming the dielectric layer includes forming a first dielectric layer on the conductive layer, forming a second dielectric layer on the first dielectric layer and forming a third dielectric layer on the second dielectric layer.

In another embodiment, the first, the second and the third dielectric layers of the dielectric layer each comprise a material selected from the group consisting of silicon oxide, silicon nitride, hafnium oxide, aluminum oxide and hafnium silicate.

In another embodiment, the first, the second and the third dielectric layers of the dielectric layer each comprise a material having a dielectric constant of at least 3.9.

In another embodiment, forming the first dielectric layer of the dielectric layer includes forming the first dielectric layer having a thickness of between about 3 nm and 5 nm, preferably about 4 nm. Forming the second dielectric layer of the dielectric layer includes forming the second dielectric layer having a thickness of between about 4 nm and 6 nm, preferably about 5 nm. Forming the third dielectric layer of the dielectric layer includes forming the third dielectric layer having a thickness of between about 4 nm and 6 nm, preferably about 5 nm.

In another embodiment, forming the first dielectric layer of the dielectric layer on the conductive layer includes forming a portion of the first dielectric layer on the top surface of the conductive layer, the portion having a first thickness. Forming further portions of the first dielectric layer on the sidewalls of the conductive layer, the further portions having a second thickness. The first thickness is larger than the second thickness.

another embodiment, the portion of the first dielectric layer on the top surface of the conductive layer is a thermal oxide layer.

In another embodiment, the further portions of the first dielectric layer on the sidewalls of the conductive layer include native oxide layers.

In another embodiment, the first thickness of the portion of the first dielectric layer on the top surface of the conductive layer is at least ten times larger than the second thickness of the further portions on the sidewalls of the conductive layer of the first dielectric layer.

In another embodiment, the further portions of the first dielectric layer on the sidewalls of the conductive layer have a thickness of below 2 nm, preferably about 1 nm, and the second dielectric layer of the dielectric layer has a thickness of below 2 nm, preferably about 1 nm.

In another embodiment, forming the charge-trapping layer stack includes forming the second dielectric layer so as to obtain a first section and a second section of the second dielectric layer and forming the third dielectric layer of the charge-trapping layer stack includes filling a recess disposed between the first section and the second section of the second dielectric layer.

In another embodiment, forming the first line includes doping a first area in the substrate, the first area extending along the first direction, and forming the second line includes doping a second area in the substrate, the second area extending along the first direction.

In another embodiment, forming the first line includes forming the first doping region in the substrate, and forming the second line includes forming the second doping region in the substrate.

In another embodiment, the method further comprises forming a plurality of wordlines extending along the second direction, forming a first and a second metal line above a top surface of the substrate, the first and second metal lines extending along the first direction. The method further comprises forming a first conductive plug, the first conductive plug coupling the first line to the first metal line, forming a second conductive plug, the second conductive plug coupling the first line to the first metal line, wherein at least three wordlines are disposed between the first conductive plug and the second conductive plug. The method further comprises forming a third conductive plug, the third conductive plug coupling the second line to the second metal line, and forming a fourth conductive plug, the fourth conductive plug coupling the second line to the second metal line, wherein at least three wordlines are disposed between the third conductive plug and the fourth conductive plug.

In another embodiment, the first line is formed in a first wiring layer of the semiconductor memory located above a top surface of the substrate and the second line is formed in a second wiring layer of the semiconductor memory located between the top surface of the substrate and the first wiring layer.

In another embodiment, the method further comprises forming a first conductive plug, the first conductive plug being coupled to the first line and the first doping region, and forming a second conductive plug, the second conductive plug being coupled to the second line and the second doping region.

In another embodiment, forming the first line and forming the second line includes removing a portion of the conductive layer, thereby exposing a region of the charge-trapping layer stack, the region of the charge-trapping layer stack extending along a first direction, doping the substrate, wherein the conductive layer inhibits dopants from entering into the substrate on areas covered by the conductive layer. Forming the dielectric layer includes thermally oxidizing a surface of the conductive layer. Forming the wordline includes depositing a polysilicon layer on the exposed region of the charge-trapping layer stack and on the dielectric layer and etching the polysilicon layer, the dielectric layer and the conductive layer along a second direction.

Another aspect of the present invention provides a method for operating a semiconductor memory according to one embodiment of the invention. The method includes providing a semiconductor memory according to one embodiment of the invention, wherein the semiconductor memory has at least one memory cell, operating the memory cell including programming the memory cell, wherein programming includes programming a first bit. Programming the first bit includes applying a first programming voltage to the second doping region and applying a second programming voltage to the wordline and grounding the first doping region, thereby inducing injection of hot electrons into a first charge storage region of the charge-trapping layer stack, wherein the first charge storage region is disposed in vicinity to the second doping region, and thereby programming the first bit in the first charge storage region.

The method further comprises programming a second bit, wherein programming the second bit includes applying a third programming voltage to the first doping region and applying a fourth programming voltage to the wordline and grounding the second doping region, thereby inducing injection of hot electrons into a second charge storage region of the charge-trapping layer stack, wherein the second charge storage region is disposed in vicinity to the first doping region and thereby programming the second bit in the second charge storage region.

In another embodiment, operating the semiconductor memory includes erasing the first bit, wherein erasing the first bit includes applying a first erasing voltage to the wordline and applying a second erasing voltage to the second doping region, thereby inducing hot hole injection in the first charge storage region and thereby erasing the first bit.

In another embodiment, operating the semiconductor memory includes erasing the second bit, wherein erasing the second bit includes applying a third erasing voltage to the wordline and applying a fourth erasing voltage to the first doping region, thereby inducing hot hole injection into the second charge storage region and thereby erasing the second bit.

In another embodiment, operating the semiconductor memory includes reading the memory cell, wherein reading out the first bit of the memory cell includes applying a first read voltage to the first doping region and applying a second read voltage to the wordline and grounding the second doping region, subsequently sensing a first current between the second doping region and the first doping region, determining if the first current is lower than a first threshold current, outputting a signal corresponding to the first bit being programmed if the first current is lower than the first threshold current, outputting a signal corresponding to the first bit being erased if the first current is higher than the first threshold current.

Reading out the second bit of the memory cell includes applying a third read voltage to the second doping region and applying a fourth read voltage to the wordline and grounding the first doping region, subsequently sensing a second current between the first doping region and the second doping region, determining if the second current is lower than a second threshold current, outputting a signal corresponding to the second bit being programmed if the second current is lower than the second threshold current. Outputting a signal corresponding to the second bit being erased if the second current is higher than the second threshold current.

In another embodiment, the present invention provides a method for operating a semiconductor memory according to one embodiment of the invention. The method comprises providing a semiconductor memory according to one embodiment of the invention, wherein the semiconductor memory has at least one memory cell. Operating the memory cell includes programming the memory cell, wherein programming includes applying a first programming voltage to the second doping region and applying a second programming voltage to the wordline and grounding the first doping region, thereby inducing injection of hot holes into a first charge storage region of the charge-trapping layer stack, wherein the first charge storage region is disposed in vicinity to the second doping region, thereby programming the first bit in the first charge storage region. Programming a second bit includes applying a third programming voltage to the first doping region and applying a fourth programming voltage to the wordline and grounding the second doping region, thereby inducing injection of hot holes into a second charge storage region of the charge-trapping layer stack, wherein the second charge storage region is disposed in vicinity to the first doping region, thereby programming the second bit in the second charge storage region.

In another embodiment, operating the memory cell includes erasing the first bit, wherein erasing the first bit includes applying a first erasing voltage to the wordline, thereby inducing Fowler-Nordheim tunneling of electrons into the first charge storage region and thereby erasing the first bit.

In another embodiment, operating the memory cell includes erasing the second bit, wherein erasing the second bit includes applying a second erasing voltage to the wordline, thereby inducing Fowler-Nordheim tunneling of electrons into the second charge storage region and thereby erasing the second bit.

In another embodiment, operating the memory cell includes reading the memory cell, wherein reading the first bit of the memory cell includes applying a first read voltage to the second doping region and applying a second read voltage to the wordline, subsequently sensing a first current between the first doping region and the second doping region, determining if the first current is lower than a first threshold current, outputting a signal corresponding to the first bit being programmed if the first current is lower than the first threshold current, outputting a signal corresponding to the first bit being erased if the first current is higher than the first threshold current. Reading the second bit of the memory cell includes applying a third read voltage to the first doping region and applying a fourth read voltage to the wordline, subsequently sensing a second current between the second doping region and the first doping region, determining if the second current is lower than a second threshold current, outputting a signal corresponding to the second bit being programmed if the second current is lower than the second threshold current, outputting a signal corresponding to the second bit being erased if the second current is higher than the second threshold current.

In another embodiment, the present invention provides a method for operating a semiconductor memory according to one embodiment of the present invention. The method comprises providing a semiconductor memory according to one embodiment of the present invention, wherein the semiconductor memory has at least one memory cell. Operating the memory cell includes programming the memory cell, wherein programming includes programming a first bit including applying a first charge-trapping layer stack programming voltage to the second doping region and applying a second charge-trapping layer stack programming voltage to the wordline and grounding the first doping region, thereby inducing injection of hot electrons into a first charge storage region of the charge-trapping layer stack, wherein the first charge storage region is disposed in vicinity to the second doping region, thereby programming the first bit in the first charge storage region.

Programming a second bit includes applying a third charge-trapping layer stack programming voltage to the first doping region, applying a fourth charge-trapping layer stack programming voltage to the wordline and grounding the second doping region, thereby inducing injection of hot electrons into a second charge storage region of the charge-trapping layer stack, wherein the second charge storage region is disposed in vicinity to the first doping region, and thereby programming the second bit in the second charge storage region. Programming a third bit includes applying a conductive layer programming voltage to the wordline, thereby inducing Fowler-Nordheim tunneling of electrons from the wordline into the conductive layer and thereby programming the third bit in the conductive layer.

In another embodiment, operating the semiconductor memory includes erasing the first bit, wherein erasing the first bit includes applying a first charge-trapping layer stack erasing voltage to the wordline and applying a second charge-trapping layer stack erasing voltage to the second doping region, thereby inducing hot hole injection into the first charge storage region and thereby erasing the first bit.

In another embodiment, operating the semiconductor memory includes erasing the second bit, wherein erasing the second bit includes applying a third charge-trapping layer stack erasing voltage to the wordline and applying a fourth charge-trapping layer stack erasing voltage to the first doping region, thereby inducing hot hole injection into the second charge storage region and thereby erasing the second bit.

In another embodiment, operating the semiconductor memory includes erasing the third bit. Erasing the third bit includes applying a first conductive layer erasing voltage to the wordline. In another embodiment, erasing the third bit includes applying a second conductive layer erasing voltage to the substrate.

In another embodiment, operating the semiconductor memory includes reading the memory cell. Reading the memory cell includes applying a first read voltage to the first doping region and applying a second read voltage to the wordline, subsequently sensing a first current between the second doping region and the first doping region, applying a third read voltage to the first doping region, applying a fourth read voltage to the wordline, subsequently sensing a second current between the second doping region and the first doping region, applying a fifth read voltage to the first doping region and applying a sixth read voltage to the wordline, subsequently sensing a third current between the second doping region and the first doping region, applying a seventh read voltage to the first doping region and applying an eighth read voltage to the wordline, subsequently sensing a fourth current between the second doping region and the first doping region. The method further comprises determining if the first current is lower than a first threshold current, determining if the second current is lower than a second threshold current, determining if the third current is lower than a third threshold current and determining if the fourth current is lower than a fourth threshold current. The method further comprises outputting a signal indicating that the first bit is erased and that the third bit is programmed if the first current is higher than the first threshold current, outputting a signal indicating that the first bit is programmed and that the third bit is programmed if the second current is higher than the second threshold current and if the first current is lower than the first threshold current. Outputting a signal indicating that the first bit is erased and that the third bit is erased if the second current is lower than the second threshold current and if the third current is higher than the third threshold current and outputting a signal indicating that the first bit is programmed and that the third bit being erased if the fourth current is higher than the fourth threshold current and if the third current is lower than the third threshold current.

BRIEF DESCRIPTION OF THE DRAWINGS

For a more complete understanding of the present invention, and the advantages thereof, reference is now made to the following descriptions taken in conjunction with the accompanying drawing, in which.

The following list of reference symbols can be used in conjunction with the figures:

| | |
|---|---|
| 1 | Substrate |
| 2 | Charge-trapping layer stack |
| 3 | Conductive layer |
| 4 | Dielectric layer |
| 5 | Wordline |
| 6 | First doping region |
| 7 | Second doping region |
| 8 | First dielectric layer of charge-trapping layer stack |
| 9 | Second dielectric layer of charge-trapping layer stack |
| 10 | Third dielectric layer of charge-trapping layer stack |
| 11 | First dielectric layer of dielectric layer |
| 12 | Second dielectric layer of dielectric layer |
| 13 | Third dielectric layer of dielectric layer |
| 14 | Isolation trench |
| 15 | Line |
| 16 | Line |
| 17 | Conductive plug |
| 18 | Conductive plug |
| 19 | Second charge storage region |
| 20 | First charge storage region |
| 21 | Memory cell |
| 22 | Channel region |
| 23 | Sidewall of conductive layer |
| 24 | First section of second dielectric layer of charge-trapping layer stack |
| 25 | Second section of second dielectric layer of charge-trapping layer stack |
| 26 | Metal line |
| 27 | Conductive plug |

DETAILED DESCRIPTION OF ILLUSTRATIVE EMBODIMENTS

Figure 1:
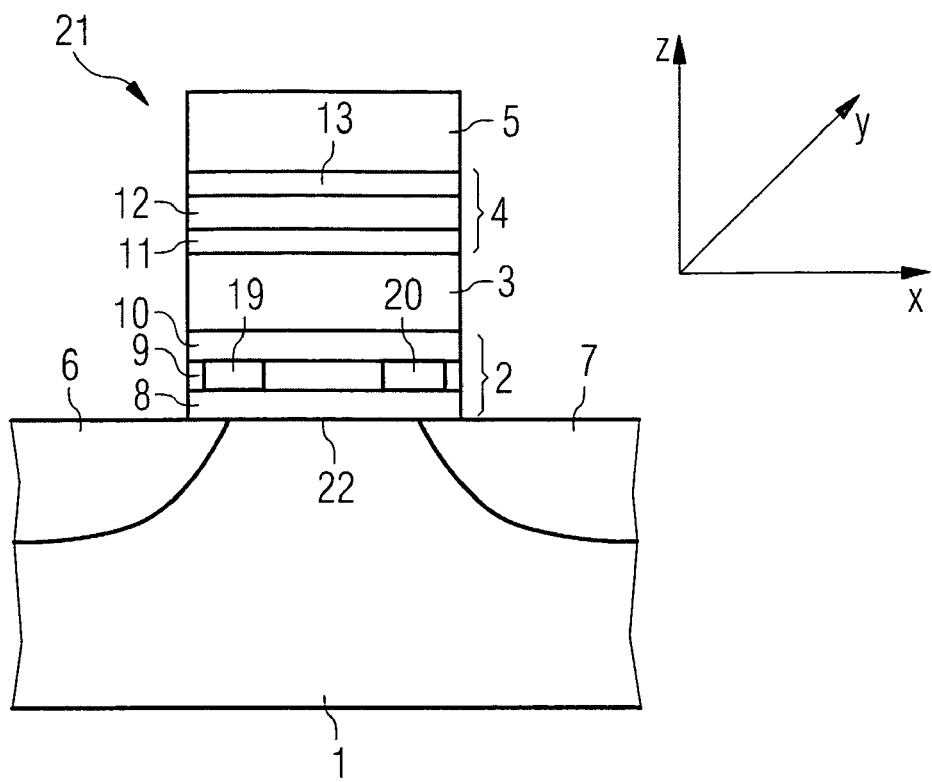
FIG. 1 depicts a cross-sectional view along a first plane of a memory cell according to one embodiment of the invention.

FIG. 1 depicts a cross sectional view along a first plane (x-z plane) of a memory cell 21 according to one embodiment of the invention. A first doping region 6 and a second doping region 7 are disposed in a substrate 1, preferably a p-type substrate, wherein the first doping region 6 and the second doping region 7 are separated by a channel region 22. The first 6 and the second 7 doping regions may be formed by implanting n-type dopants, such as arsine or phosphor, in the substrate 1. A charge-trapping layer stack 2 is disposed on the substrate 1, on the channel region 22, on a portion of the first doping region 6 and on a portion of the second doping region 7. The charge-trapping layer stack 2 may comprise silicon oxide, silicon nitride, hafnium oxide, aluminum oxide or another material having a dielectric constant of at least 3.9. The charge-trapping layer stack 2 may comprise several dielectric layers. In one embodiment the charge-trapping layer stack comprises a first 8, a second 9 and a third 10 dielectric layer. The first 8 and the third 10 dielectric layers each may comprise silicon oxide or hafnium oxide. Alternatively, the first 8 and the third 10 dielectric layers each may comprise another material having a dielectric constant of at least 3.9. The second 9 dielectric layer may comprise a material selected from the group consisting of silicon nitride, hafnium oxide and aluminum oxide. Alternatively, the second dielectric layer 9 may comprise another material having a dielectric constant of at least 3.9.

The first dielectric layer 8 is disposed on the substrate 1, the second dielectric layer 9 is disposed on the first dielectric layer 8 and the third dielectric layer 10 is disposed on the second dielectric layer 9. The first dielectric layer 8 may have a thickness of about 5 nm, the second dielectric layer 9 may have a thickness of about 5 nm and the third dielectric layer 10 may have a thickness of about 6 nm. On the charge-trapping layer stack 2 a conductive layer 3 is disposed, wherein the conductive layer 3 is electrically floating. The conductive layer 3, that may comprise doped polysilicon, is not connected to any line and can be used for charge storage. The conductive layer 3 may comprise p-doped polysilicon or n-doped polysilicon. Alternatively, the conductive layer 3 may comprise a metal, wherein the metal is selected from the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr. A dielectric layer 4 is disposed on the conductive layer 3. The dielectric layer 4 may comprise silicon oxide, silicon nitride, hafnium oxide or aluminum oxide. Alternatively, the dielectric layer 4 may comprise another material having a dielectric constant of at least 3.9. The dielectric layer 4 may comprise several dielectric layers. In one embodiment the dielectric layer 4 comprises a first 11, a second 12 and a third 13 dielectric layer. Each of the first 11, the second 12, and the third 13 dielectric layers of the dielectric layer 4 may be formed by a material selected from the group consisting of silicon oxide, silicon nitride, hafnium oxide, aluminum oxide or another material having a dielectric constant of at least 3.9.

The first dielectric layer 11 of the dielectric layer 4 is disposed on the conductive layer 3, the second dielectric layer 12 of the dielectric layer 4 is disposed on the first dielectric layer 11 and the third dielectric layer 13 of the dielectric layer 4 is disposed on second dielectric layer 12. The first dielectric layer 11 of the dielectric layer 4 may have a thickness of about 4 nm, the second dielectric layer 12 of the dielectric layer 4 may have a thickness of about 5 nm and the third dielectric layer 13 of the dielectric layer 4 may have a thickness of about 5 nm. A wordline 5 is disposed on the dielectric layer 4. The wordline 5 may comprise p-doped polysilicon or n-type polysilicon. Alternatively, the wordline 5 may comprise a metal, wherein the metal is selected from the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr.

In operation of the memory cell 21, the wordline 5 has the functionality of a control gate. The first doping region 6 and the second doping region 7 both have the interchangeable functionality of a source and a drain, respectively, of a transistor. The conductive layer 3, that is electrically floating, can have the functionality of a floating gate.

In conventional operation, a voltage potential is applied between the first doping region 6 and the second doping region 7. Then a voltage potential is applied to the wordline 5. Once the voltage potential applied to the wordline 5 surpasses a characteristic threshold voltage $V_t$, a conductive channel forms between the first doping region 6 and the second doping region 7 and a current signal can be detected. The level of the characteristic threshold voltage $V_t$ is affected by charges located between the wordline 5 and the channel. For example, the threshold voltage $V_t$ is shifted towards a lower voltage level when charge is located between the channel and the wordline 5. The difference between the levels of the threshold voltages between a state wherein charge is located between the channel and the wordline 5 and a state wherein no charge is located between the channel and the wordline 5 is referred to as threshold voltage shift. Therefore, deposition of fixed charges between the wordline 5 and the channel can be utilized to store binary bits of information in the memory cell, wherein different threshold voltage levels can be assigned to different binary values.

The memory cell 21 is capable of storing at least two bits of information, a first bit in a first charge storage region 20 located in the charge-trapping layer stack 2 in vicinity to the second doping region 7 and a second bit in a second charge storage region 19 located in the charge-trapping layer stack 2 in vicinity to the first doping region 6.

The incorporation of the conductive layer 3 according to an embodiment of the present invention allows to reduce the EOT of the charge-trapping layer stack 2 to a level that is lower than that of a conventional NROM for the same threshold voltage shift. The reason is related to the fact that the total threshold voltage shift is divided into two parts: one originating from the capacitive coupling of the stored charge to the conductive layer and the other originating from the capacitive coupling of the conductive layer to the wordline. In addition, since a small EOT of the charge-trapping layer stack where the charge is stored is beneficial for the transistor properties, such a floating gate structure is likely to have better scaling properties than a conventional NROM device for a given threshold voltage shift. The physical reason for the better electrostatics of the floating gate NROM device is related to the fact that the smaller the capacitance of a conductive layer (wordline 5 or conductive layer 3) to the channel the better the screening of electric fields between source and drain. In other words, the short channel effects are best screened in devices where the conductive layer is closest to the channel. Accordingly, memory cells having a smaller minimal feature size F than that of conventional NROMs can be realized.

In a zero order approximation, the threshold voltage shift $\delta V_t$ is given by:

$$\delta V_t = \delta V_{t\,CL\text{-}Channel}/Y,$$

wherein $\delta V_{t\,CL\text{-}Channel}$ is the effective shift of the threshold voltage potentials applied across the conductive layer 3 and the channel, and wherein the capacitive coupling factor y is defined by:

$$y = C_{CL\text{-}WL}/C_{tot},$$

$C_{tot}$ is the total capacitance of the conductive layer 3 relative to the environment, and $C_{CL\text{-}WL}$ is the capacitance of the conductive layer 3 relative to the wordline 5.

Accordingly, a capacitive coupling factor below 1 increases the threshold voltage shift $\delta V_t$.

In one embodiment of the invention, the first dielectric layer 8 of the charge-trapping layer stack 2 is an oxide layer having a thickness of 6 nm, the second dielectric layer 9 of the charge-trapping layer stack is a nitride layer having a thickness of 5 nm and the third dielectric layer 10 of the charge-trapping layer stack is an oxide layer having a thickness of 5 nm. This results in an EOT of the charge-trapping layer stack of 13 nm and in a capacitive coupling factor of 0.5. Hence, the threshold voltage shift is doubled compared to the threshold voltage shift of conventional NROMs that have a charge-trapping layer stack with an EOT of 13 nm.

A logical state "1" can be programmed into the first bit by applying programming voltages to the second doping region 7 and the wordline 5 and grounding the first doping region 6 and thereby inducing hot electron injection from the channel into the first charge storage region 20. The electrons become trapped in the first charge storage region 20. The trapped electrons generate an electrical barrier that effects a change of the characteristic threshold voltage of the memory cell. The voltage potential applied to the wordline 5 for programming the first bit may be 12 V and the voltage potential applied to the second doping region 7 may be 5 V.

The logical state "1" of the first bit can be erased, thereby creating a state "0" of the first bit, by applying erasing voltages to the second doping region 7 and the wordline 5 and thereby inducing hot hole injection into the first charge storage region 20. The voltage potential applied to the second doping region 7 may be 5 V and the voltage potential applied to the wordline 5 may be −5 V.

A reading operation to determine whether the first bit is programmed or erased may include applying a reading voltage to the first doping region 6, grounding the second doping region 7, stepwise increasing a voltage potential applied to the wordline 5 and sensing a current between the second doping region 7 and the first doping region 6. From the voltage level, at which the current reaches a threshold current $I_t$, it can be determined if the first bit is programmed or erased. If the first bit is erased, a voltage potential equal to or higher than a threshold voltage $V_{t1}$ has to be applied to the wordline 5 to sense a current equal to or higher than the threshold current $I_t$. If the first bit is programmed, a voltage potential equal to or higher than a threshold voltage $V_{t2}$ has to be applied to the wordline to sense a current equal to or higher than the threshold current $I_t$, wherein $V_{t2}$ is higher than $V_{t1}$. The difference between $V_{t2}$ and $V_{t1}$ defines the threshold voltage shift.

Programming, erasing and reading of the second bit of the memory cell is carried out in correspondence to programming, erasing and reading of the first bit of the memory cell, wherein the second doping region 7 has the functionality of the first doping region 6, and wherein the first doping region 6 has the functionality of the second doping region 7.

The memory cell 21 may also be operable to store multiple bits in either of the first 20 or second 19 charge storage regions by controlling the amount of charge injected into the charge storage regions during programming. Different amounts of charge stored in either of the first 20 or second 19 charge storage regions effect different levels of the threshold voltage. Thus, multiple bits can be stored in the memory cell 21 by assigning each level of the threshold voltage a memory state.

Figure 2:
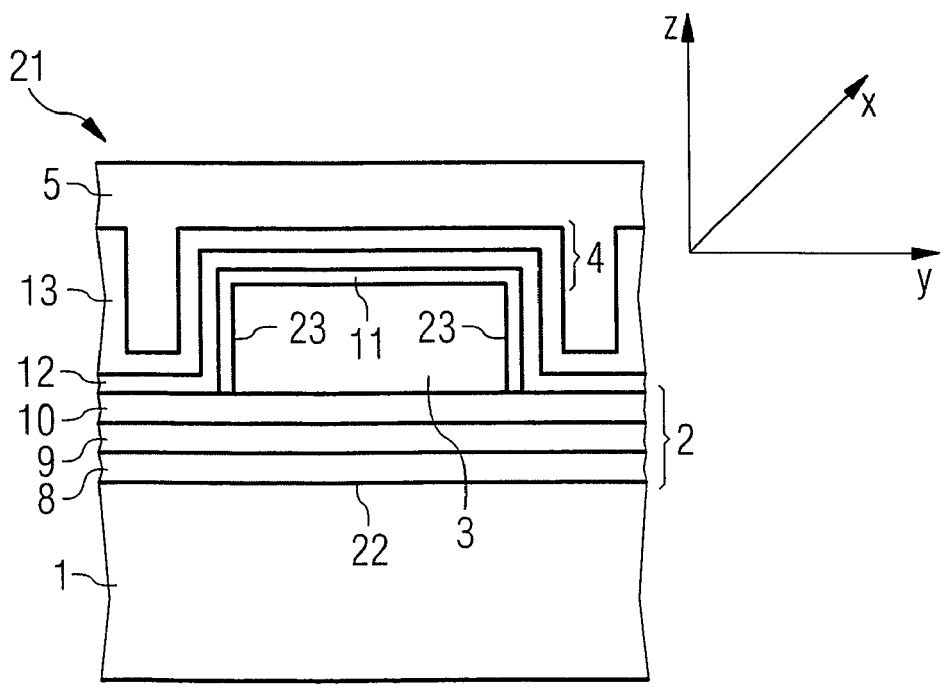
FIG. 2 shows a cross-sectional view of the memory cell depicted in FIG. 1 along a second plane.

FIG. 2 shows a cross sectional view of the memory cell 21 depicted in FIG. 1 along a second plane (y-z plane). Memory cells 21 of a semiconductor memory are arranged periodically on the substrate along preferred directions (x- and y-direction). This arrangement is, e.g., shown in FIG. 12. The charge-trapping layer stack 2 is disposed on the substrate 1 and extends laterally beyond the memory cell 21. The conductive layer 3 is disposed on a portion of the charge-trapping layer stack 2. The dielectric layer 4 is disposed on the top and on sidewalls 23 of the conductive layer 3. A portion of the second dielectric layer 12 of the dielectric layer 4 is disposed on a portion of the third dielectric layer 10 of the charge-trapping layer stack 2, wherein the portion of the third dielectric layer 10 of the charge-trapping layer stack 2 is located between conductive layers 3 of memory cells 21 adjacent to one another. The dielectric layer 4 extends into recesses between conductive layers 3 of memory cells 21 adjacent to one another. The wordline 5 extends into the recesses between the conductive layers 3 of memory cells 21 adjacent to one another and is disposed on the dielectric layer 4 in the recesses. The charge-trapping layer stack 2 is provided under the wordline 5 and under the recesses and is in contact with the substrate 1 and the dielectric layer 4.

Figure 3:
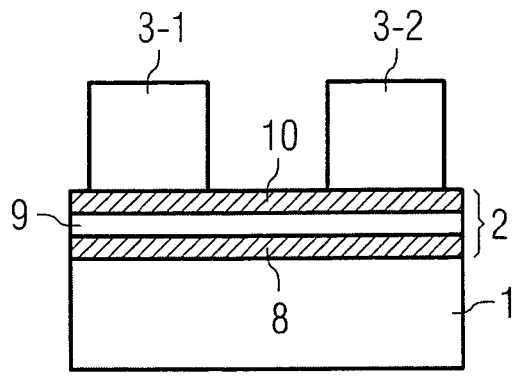
FIG. 3 shows a cross-sectional view of a semiconductor memory according to one embodiment of the invention along a first plane in a stage of the fabrication process.

FIG. 3 shows a cross sectional view of a semiconductor memory according to one embodiment of the invention along a first plane in a stage of the fabrication process. A charge-trapping layer stack 2 comprising a first dielectric layer 8, a second dielectric layer 9 and a third dielectric layer 10 is disposed on a substrate 1. Conductive layers 3-1, 3-2 are disposed on portions of the charge-trapping layer stack 2, wherein the conductive layers 3-1, 3-2 extend along a first direction. The conductive layers 3-1, 3-2 may be formed by depositing polysilicon on the charge-trapping layer stack 2 and structuring the polysilicon by conventional lithography and etching processes such that conductive layers 3-1, 3-2 are formed extending along the first direction.

Figure 4:
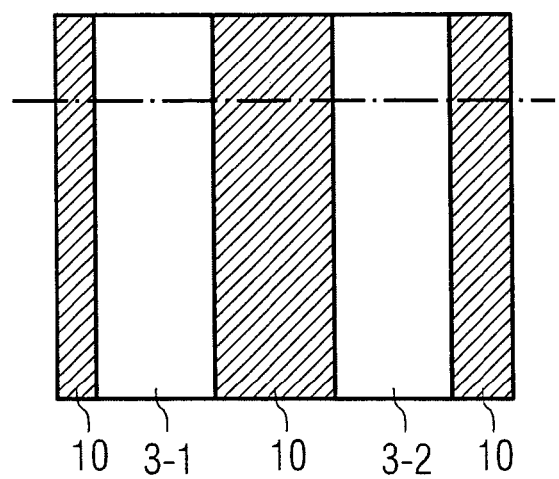
FIG. 4 depicts a plan view of the semiconductor memory in the stage of the fabrication process as depicted in FIG. 3.

FIG. 4 depicts a plan view of the semiconductor memory in the stage of the production process as depicted in FIG. 3. The conductive layers 3-1, 3-2 are disposed on regions of the third dielectric layer 10 of the charge-trapping layer stack 2 such that portions of the third dielectric layer 10 extending along the first direction are not covered by the conductive layers 3-1, 3-2.

Figure 5:
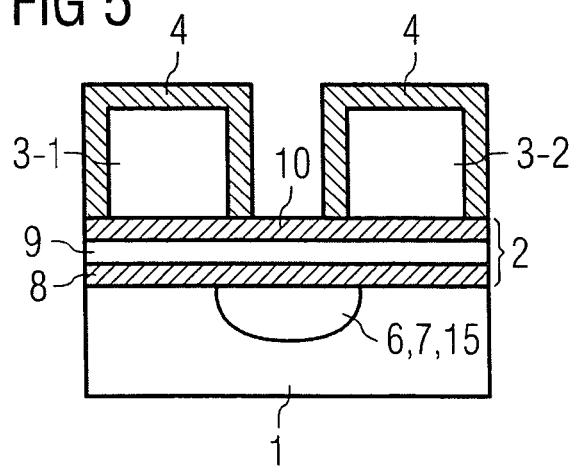
FIG. 5 shows a cross-sectional view of the semiconductor memory as depicted in FIG. 3 in another stage of the fabrication process along the first plane.

FIG. 5 shows a cross sectional view of the semiconductor memory as depicted in FIG. 3 in another stage of the production process along the first plane. As compared to FIG. 3, a doped area 6, 7, 15 is disposed in the substrate 1 in areas that are not covered by the conductive layers 3-1, 3-2. The doped area 6, 7, 15 is formed by doping the substrate 1 with n-type dopants such as arsine or phosphor by an implanting technique, wherein the dopants are inhibited from entering the substrate 1 in regions covered by the conductive layers 3-1, 3-2 such that the conductive layers 3-1 and 3-2 act as a mask during the implanting process. The doped area 6, 7, 15 includes the first doping region 6 of a memory cell 21 and the first line 15-1. The first line 15-1 is located in the substrate 1 and is a first buried bitline of the semiconductor memory. Additionally, the doped area 6, 7, 15 may include the second doping region 7 and the second line 15-2, 16-2 of a further memory cell 21. A dielectric layer 4 is disposed on top surfaces and on sidewalls of the conductive layers 3-1 and 3-2. The dielectric layer 4 may be formed by a thermal oxidation, thereby oxiding surfaces of the conductive layers 3-1 and 3-2.

Figure 6:
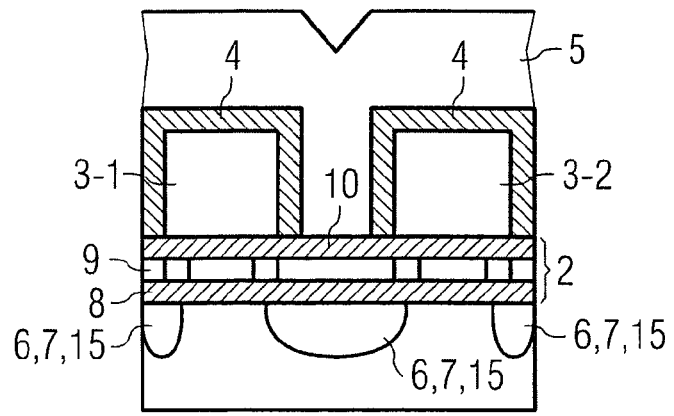
FIG. 6 shows a cross-sectional view of the semiconductor memory as depicted in FIG. 5 along the first plane in another step of the fabrication process.

FIG. 6 shows a cross sectional view of the semiconductor memory depicted in FIG. 5 along the first plane in another step of the fabrication process. As compared to FIG. 5, a wordline 5 is disposed on a top surface and on sidewalls of the dielectric layer 4 and on portions of the charge-trapping layer stack 2. The wordline 5 may be formed by depositing polysilicon on exposed portions of the charge-trapping layer stack 2, on the top surface and on sidewalls of the dielectric layer 4 and subsequently etching portions of the polysilicon, portions of the dielectric layer 4 and portions of the conductive layers 3-1, 3-2 along a second direction that is different from the first direction such that the wordline 5 is formed.

Figure 7:
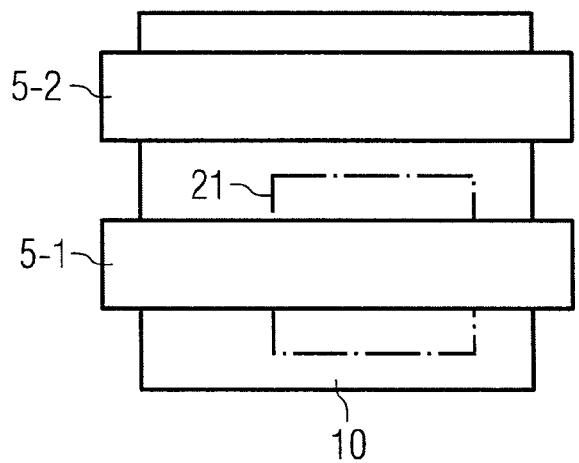
FIG. 7 shows a plan view of the semiconductor memory in the stage of the fabrication process as depicted in FIG. 6.

FIG. 7 shows a plan view of the semiconductor memory in the stage of the production process as depicted in FIG. 6. Portions of the third dielectric layer 10 of the charge-trapping layer stack are exposed, wherein the exposed portions extend along the second direction. The dashed rectangle schematically indicates the area taken by a memory cell 21. Wordlines 5-1 and 5-2 extend along the second direction.

Figure 8:
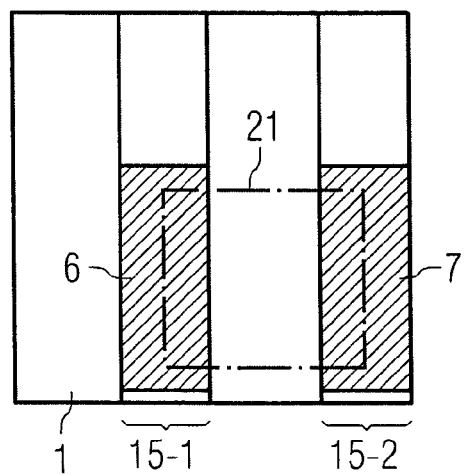
FIG. 8 shows schematically the arrangement of a memory cell according to one embodiment of the invention with regard to a first line and a second line.

FIG. 8 shows schematically the arrangement of the memory cell 21 as depicted in FIG. 7 with regard to the first line 15-1 and the second line 15-2. The first line 15-1 and the second line 15-2 are buried in the substrate 1 and are a first bitline and a second bitline, respectively, of the semiconductor memory. In this embodiment, the first doping region 6 of the memory cell 21 is a portion of the first line 15-1 and the second doping region 7 of the memory cell 21 is a portion of the second line 15-2. Accordingly, the first line 15-1 includes the first doping region 6 and the second line 15-2 includes the second doping region 7.

Figure 9:
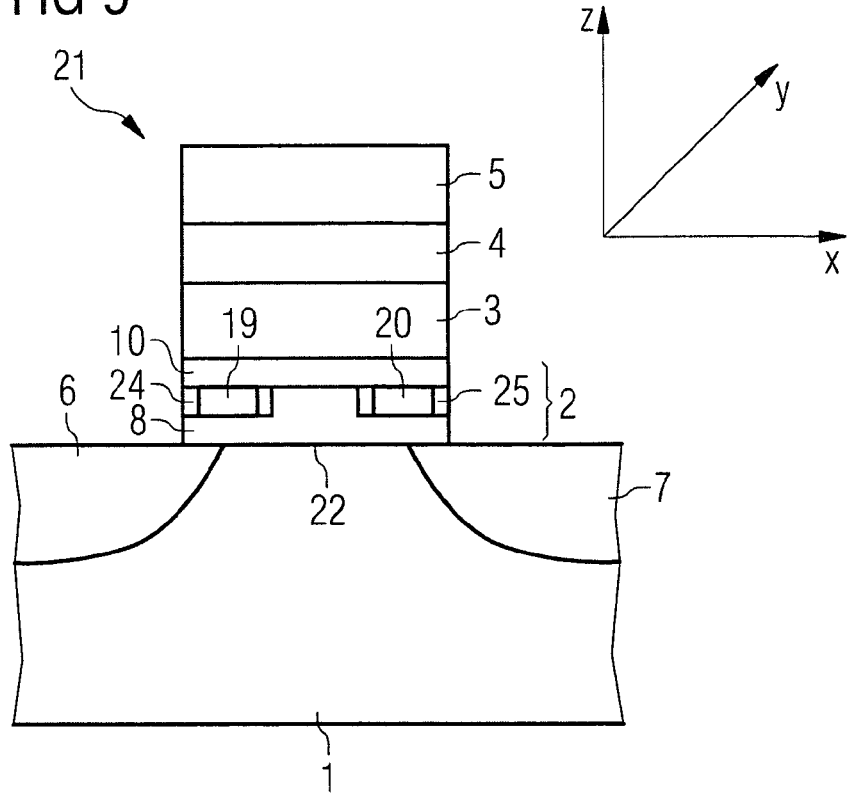
FIG. 9 shows a cross-sectional view along a first plane of a memory cell according to one embodiment of the invention.

FIG. 9 shows a cross sectional view of a memory cell 21 according to another embodiment of the invention along a first plane (x-z plane). In contrast to the embodiment depicted in FIG. 1, the second dielectric layer 9 of the charge-trapping layer stack 2 is formed to have a first section 24 disposed in vicinity to the first doping region 6 and to have a second section 25 disposed in vicinity to the second doping region 7. A portion of the third dielectric layer 10 of the charge-trapping layer stack 2 is disposed in a recess formed between the first section 24 and the second section 25 of the second dielectric layer 9 of the charge-trapping layer stack 2.

Figure 10:
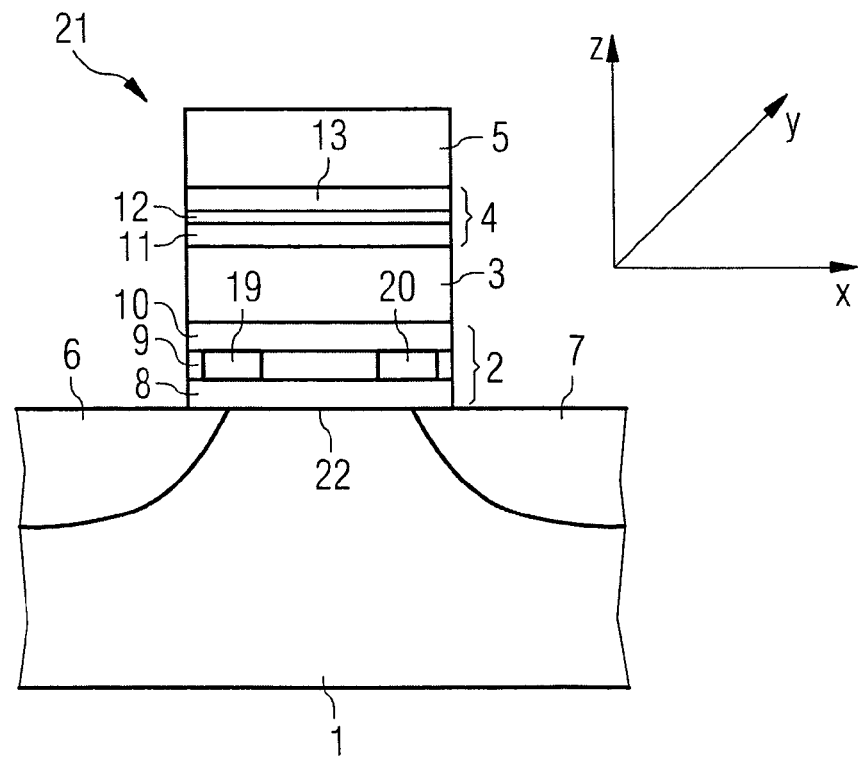
FIG. 10 shows a cross-sectional view of a memory cell along a first plane according to one embodiment of the invention.

In FIG. 10, a cross-sectional view along a first plane (x-z plane) of a memory cell 21 according to another embodiment of the present invention is depicted. As compared to the embodiment shown in FIG. 1, the second dielectric layer 12 of the dielectric layer 4 is thinner. The second dielectric layer 12 of the dielectric layer 4 may have a thickness of below 2 nm, preferably about 1 nm.

Figure 11:
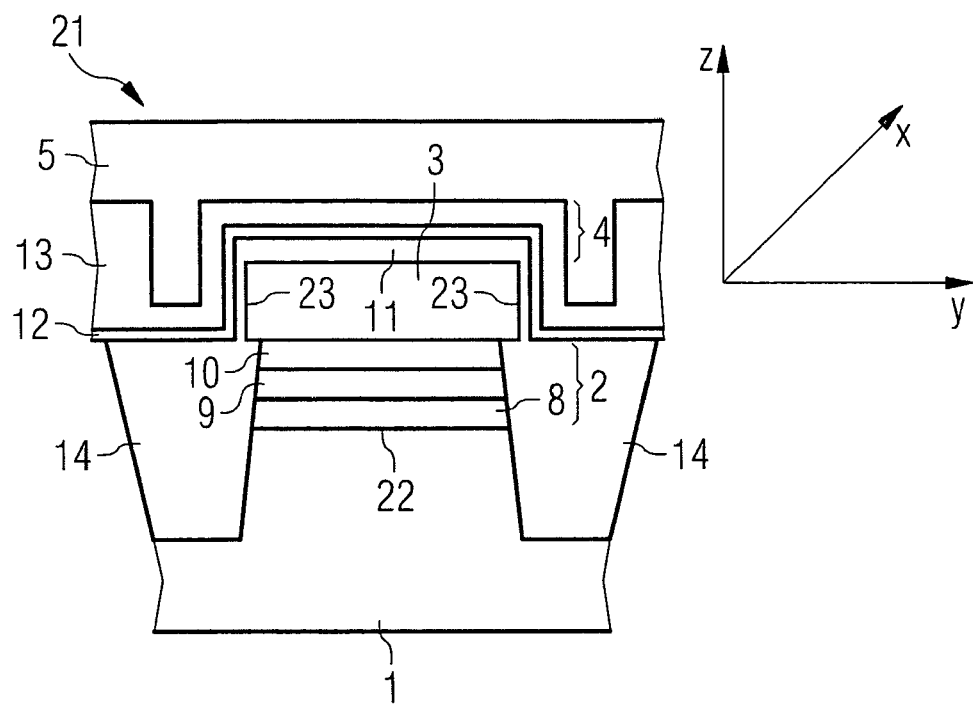
FIG. 11 depicts a cross-sectional view along the second plane of the memory cell as depicted in FIG. 10.

FIG. 11 depicts a cross-sectional view along a second plane (y-z plane) of the memory cell 21 as depicted in FIG. 10. Opposed to the memory cell 21 depicted in FIG. 2, isolation trenches 14, that are filled with trench isolation filling, are disposed in the charge-trapping layer stack 2 and in the substrate 1. The trench isolation filling may comprise polysilicon. The trenches 14 separate channel regions 22 of memory cells 21 adjacent to one another. The dielectric layer 4 is located on the top surface and on the sidewalls 23 of the conductive layer 3 and on the trench isolation filling. The conductive layer 3 is electrically floating. The dielectric layer 4 extends into recesses between conductive layers 3 of memory cells 21 adjacent to one another. The wordline 5 extends into the recesses and is disposed on the dielectric layer 4 in the recesses. The dielectric layer 4 is provided in the recesses between the trench isolation filling and the wordline 5 and is in contact with the wordline 5 and the trench isolation filling. A portion of the first dielectric layer 11 of the dielectric layer 4 disposed on the top surface of the conductive layer is thicker than further portions of the first dielectric layer 11 disposed on the sidewalls 23 of the conductive layer 3. The portion of the first dielectric layer 11 of the dielectric layer 4 disposed on the top surface of the conductive layer 3 is preferably a thermal oxide. The further portions of the first dielectric layer 11 of the dielectric layer 4 disposed on the sidewalls 23 of the conductive layer 3 are preferably native oxide layers. Preferably, the portions of the first dielectric layer 11 disposed on the sidewalls 23 of the conductive layer 3 have a thickness of about 1 nm and the portion of the first dielectric layer 11 disposed on the top surface of the conductive layer 3 has a thickness of about 15 nm.

In addition to the functionality of storing a first bit in the first charge storage region 20 and a second bit in the second charge storage region 19, the memory cell having the above-described layout is capable of storing at least a third bit in the electrically floating conductive layer 3 without disturbing the state of the first and the second bits. Furthermore, programming, reading and erasing of the first and the second bits does not disturb the state of the third bit.

Programming of a state "1" of the third bit is effected by applying a conductive layer programming voltage to the wordline 5, thereby inducing Fowler-Nordheim tunneling of electrons from the wordline 5 into the conductive layer 3. The conductive layer programming voltage applied to the wordline 5 may be about 16 V. Due to the different dimensions of the first dielectric layer 11 of the dielectric layer 4 disposed on the sidewalls 23 and on the top surface of the electrically floating conductive layer 3, electrons preferably tunnel from the wordline 5 into the conductive layer 3 through the portion of the dielectric layer 4 disposed on the sidewalls 23 of the conductive layer 3. The portion of the first dielectric layer 11 disposed on the top surface of the conductive layer 3 reduces a portion of the vertical component of the electrical field applied during programming, reading or erasing of the third bit. Therefore, the portion of the effective electrical field between the conductive layer 3 and the channel during programming, reading or erasing of the third bit is too low to induce injection of charges from the channel into the charge-trapping layer stack 2 and the third bit can be programmed, read or erased without disturbing the state of the first bit and the second bit.

Erasing of the state "1" of the third bit is effected by applying a first conductive layer erasing voltage to the substrate 1, thereby inducing Fowler-Nordheim tunneling of electrons from the conductive layer 3 into the wordline 5. The first conductive layer erasing voltage applied to the substrate 1 may be about 16 V. Alternatively, a second conductive layer erasing voltage can be applied to the wordline 5, thereby inducing Fowler-Nordheim tunneling of electrons from the conductive layer 3 into the wordline 5. The second conductive layer erasing voltage applied to the wordline 5 may be about −16 V.

Figure 12:
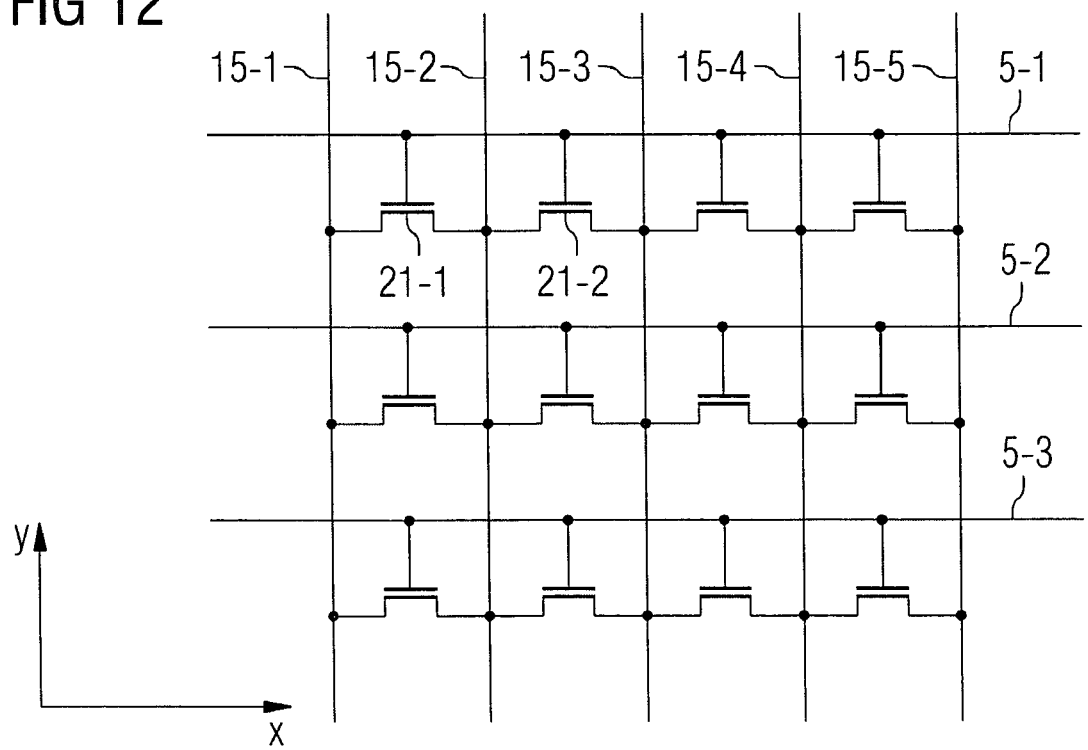
FIG. 12 shows schematically a wiring layout of a semiconductor memory according to one embodiment of the invention.

FIG. 12 shows schematically a wiring layout of a semiconductor memory according to one embodiment of the invention, in which adjacent memory cells 21-1 and 21-2 share a common line 15-2. The first memory cell 21-1 is connected to a first line 15-1 and to a second line 15-2, wherein the first 15-1 and the second 15-2 lines extend along a first direction (y-direction). The first 15-1 and the second 15-2 lines are a first and a second bitline, respectively, of the semiconductor memory. Furthermore, the first memory cell 21-1 is connected to a wordline 5-1 extending along a second direction (x-direction) that is different from the first direction. A second memory cell 21-2 is connected to the same wordline 5-1 as the first memory cell 21-1 and to the same second line 15-2 as the first memory cell 21-1. In addition, the second memory cell 21-2 is connected to a third line 15-3 extending along the first direction, wherein the third line 15-3 may be a third bitline of the semiconductor memory.

Figure 13:
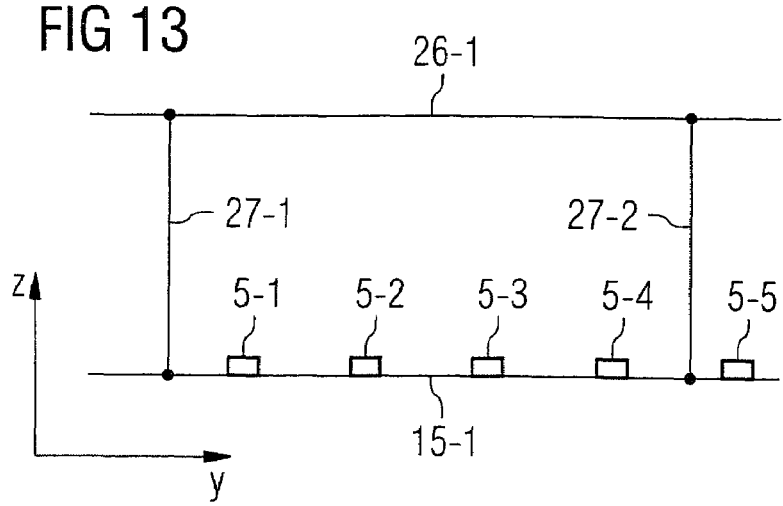
FIG. 13 shows schematically the coupling of a first buried bitline of semiconductor memory to a first metal line according to one embodiment of the invention.

FIG. 13 shows schematically the coupling of a first buried bitline of a semiconductor memory to a first metal line according to one embodiment of the invention. A first line 15-1 extends along a first direction (y-direction). The first line 15-1 is a first bitline and is buried in a substrate 1 (not shown in FIG. 13) as depicted in FIG. 8. Wordlines 5-1, 5-2, 5-3, 5-4, 5-5 extend along a second direction (z-direction). A first metal line 26-1, having a lower electrical resistance than the first line 15-1, extends along the first direction and is located at a distance from a top surface of the substrate 1 (not shown in FIG. 13). The first line 15-1 and the first metal line 26-1 are coupled by conductive plugs 27-1, 27-2. Between adjacent conductive plugs 27-1, 27-2 four wordlines 5-1, 5-2, 5-3 and 5-4 are disposed. Alternatively, more than four or less than four wordlines 5 may be disposed between adjacent conductive plugs 27-1, 27-2. Preferably, sixteen wordlines 5 are disposed between adjacent conductive plugs 27-1, 27-2. This arrangement effects that a smaller portion of the substrate 1 is used to contact source and drain regions of the memory cell of a semiconductor device as compared to a conventional arrangement in which each source and drain region of each memory cell are coupled by single plugs to lines located above the substrate.

Figure 14:
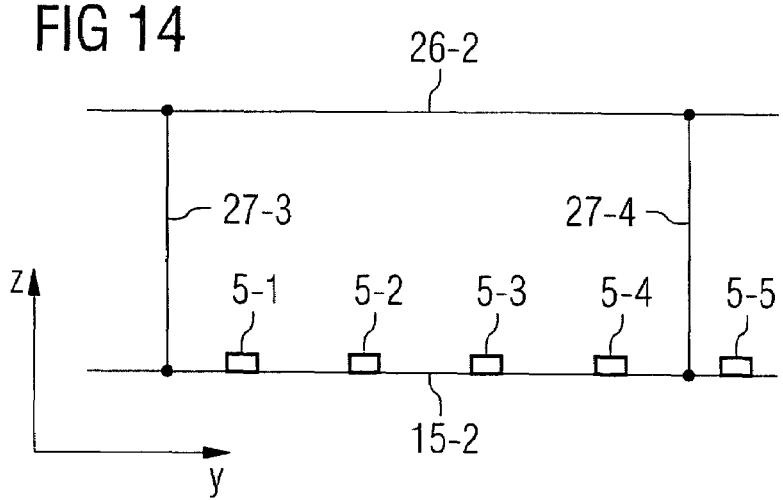
FIG. 14 shows schematically the coupling of a second buried bitline of the semiconductor memory as depicted in FIG. 13 to a second metal line according to one embodiment of the invention.

FIG. 14 shows schematically the coupling of a second buried bitline of the semiconductor memory as depicted in FIG. 13 to a second metal line according to one embodiment of the invention. A second line 15-2 extends along a first direction (y-direction). The second line 15-2 is a second bitline and is buried in the substrate 1 (not shown in FIG. 14). Wordlines 5-1, 5-2, 5-3, 5-4, 5-5 extend along a second direction (z-direction). A second metal line 26-2, having a lower electrical resistance than the second line 15-2, extends along the first direction and is located above a top surface of a substrate 1 (not shown in FIG. 13). The second line 15-2 and the second metal line 26-2 are coupled by conductive plugs 27-3 and 27-4. Between adjacent conductive plugs 27-3 and 27-4 four wordlines 5-1, 5-2, 5-3 and 5-4 are disposed. Alternatively, more than four or less than four wordlines 5 may be disposed between adjacent conductive plugs 27-3 and 27-4. Preferably, sixteen wordlines 5 are disposed between adjacent conductive plugs 27-3 and 27-4. This arrangement effects that a smaller portion of the substrate is used to contact source and drain regions of the memory cell of a semiconductor device as compared to a conventional arrangement in which each source and drain region of each memory cell are coupled by single plugs to lines located above the substrate.

Figure 15:
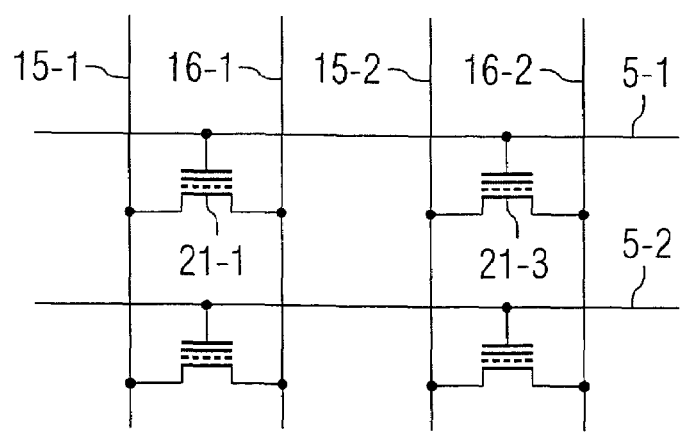
FIG. 15 shows schematically a wiring layout of a semiconductor memory according to one embodiment of the invention.

FIG. 15 shows a wiring layout of a semiconductor memory according to one embodiment of the present invention. A first memory cell 21-1 is connected to a first line 15-1 and to a second line 16-1, wherein the first line 15-1 and the second line 16-1 extend along a first direction. Furthermore, the memory cell 21-1 is connected to a wordline 5-1 extending along a second direction that is different from the first direction. A second memory cell 21-3 is connected to the same wordline 5-1 as the first memory cell 21-1. In addition, the second memory cell 21-3 is connected to a third line 15-2 and to a fourth line 16-2, wherein the third line 15-2 and the fourth line 16-2 extend along the first direction. First 15-1, second 16-1, third 15-2 and fourth 16-2 lines may be first, second, third and fourth bitlines, respectively, of the semiconductor memory.

Figure 16:
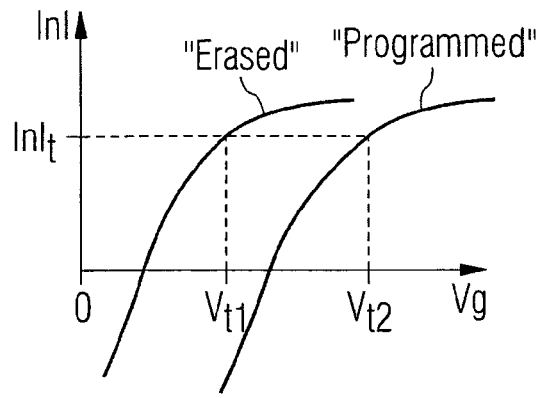
FIG. 16 is a graph plotting currents between source and drain for different logical states of a memory cell versus voltage applied to the wordline according to one embodiment of the invention.

FIG. 16 is a graph plotting the logarithm of current signals ln I between the second doping region 7 and the first doping region 6 of a memory cell that is capable of storing a first bit in the first charge storage region 20 according to one embodiment of the invention, versus a voltage $V_g$ applied to the wordline 5. The curve labeled "erased" refers to a state of the memory cell in which the first bit is erased. The curve labeled "programmed" refers to a state of the memory cell in which the first bit is programmed. As depicted, in the erased state the logarithm of the sensed current is higher than the logarithm of the threshold current It when applying a voltage potential higher than $V_{t1}$ to the wordline 5. In the programmed state, however, the logarithm of the sensed current is lower than the threshold current $I_t$ when applying $V_{t1}$ to the wordline 5. The logarithm of the sensed current only exceeds the logarithm of the threshold current $I_t$ when applying a voltage potential higher than $V_{t2}$ to the wordline 5. Thus, it can be determined if the first bit is stored or erased by applying a voltage to the wordline having a value between $V_{t1}$ and $V_{t2}$, sensing the current between the second doping region 7 and the first doping region 6 and subsequently determining if the current is higher or lower than the threshold current.

Figure 17:
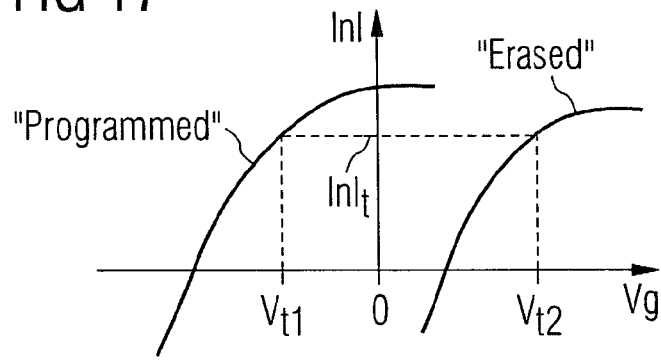
FIG. 17 is a graph plotting currents between source and drain for different logical states of a memory cell versus voltage applied to the wordline according to one embodiment of the invention.

FIG. 17 is a graph plotting the logarithm of current signals ln I between the second doping region 7 and the first doping region 6 of a memory cell that is capable of storing a bit in the conductive layer 3 according to one embodiment of the invention versus a voltage $V_g$ applied to the wordline 5. The curve labeled "programmed" refers to a state of the memory cell in which the bit in the conductive layer 3 is programmed. The curve labeled "erased" refers to the state of the memory cell in which the bit in the conductive layer 3 is erased. The threshold voltage of the memory cell equals $V_{t1}$ when the bit in the conductive layer 3 is programmed and the threshold voltage of the memory cell equals $V_{t2}$ when the bit in the conductive layer 3 is erased. Thus, the state of the bit in the conductive layer 3 can be determined by applying a voltage potential to the gate that has a value between $V_{t1}$ and $V_{t2}$, sensing the current between the second doping region 7 and the first doping region 6 and subsequently determining if the current is higher or lower than the threshold current.

Figure 18:
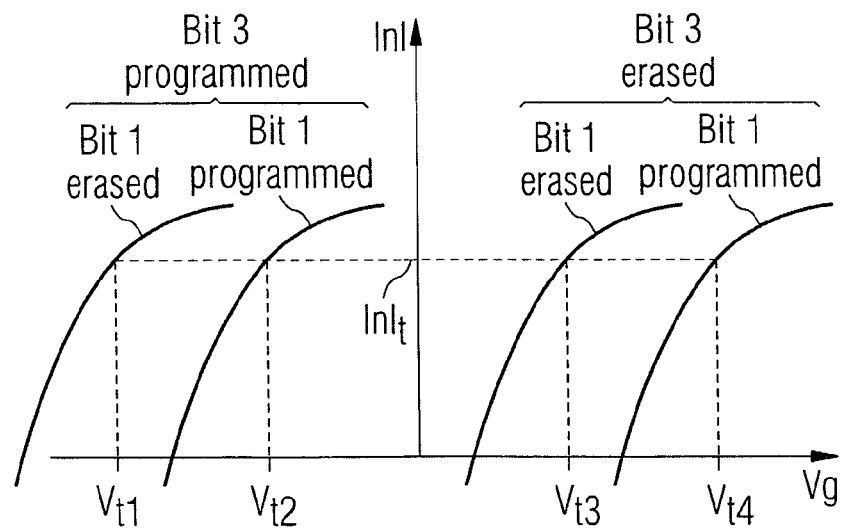
FIG. 18 is a graph plotting currents between source and drain for different logical states of a memory cell versus voltage applied to the wordline according to one embodiment of the invention.

FIG. 18 is a graph plotting the logarithm of current signals ln I between the second doping region 7 and the first doping region 6 of a memory cell that is capable of storing a first bit in a first charge storage region 20, storing a second bit in a second charge storage region 19 and storing a third bit in an electrically floating conductive layer 3 versus a voltage $V_g$ applied to the wordline 5. As depicted, four different states of the memory cell corresponding to the threshold voltages $V_{t1}$, $V_{t2}$, $V_{t3}$ and $V_{t4}$ can be distinguished. Table 1 shows the threshold voltages with regard to the states of the first bit in the first charge storage region 20 and the states of the third bit in the electrically floating conductive layer 3.

TABLE 1

| Bit in charge storage region (first bit) | Bit in electrically floating conductive layer (third bit) | Threshold voltage |
| --- | --- | --- |
| Erased | Programmed | $V_{t1}$ |
| Programmed | Programmed | $V_{t2}$ |
| Erased | Erased | $V_{t3}$ |
| Programmed | Erased | $V_{t4}$ |

When utilizing the second charge storage region 19 of the memory cell to store another bit of information, eight distinguishable states of the memory cell corresponding to eight different threshold voltages exist. Accordingly, the memory cell has the capacity to store three bits of information.

Figure 19:
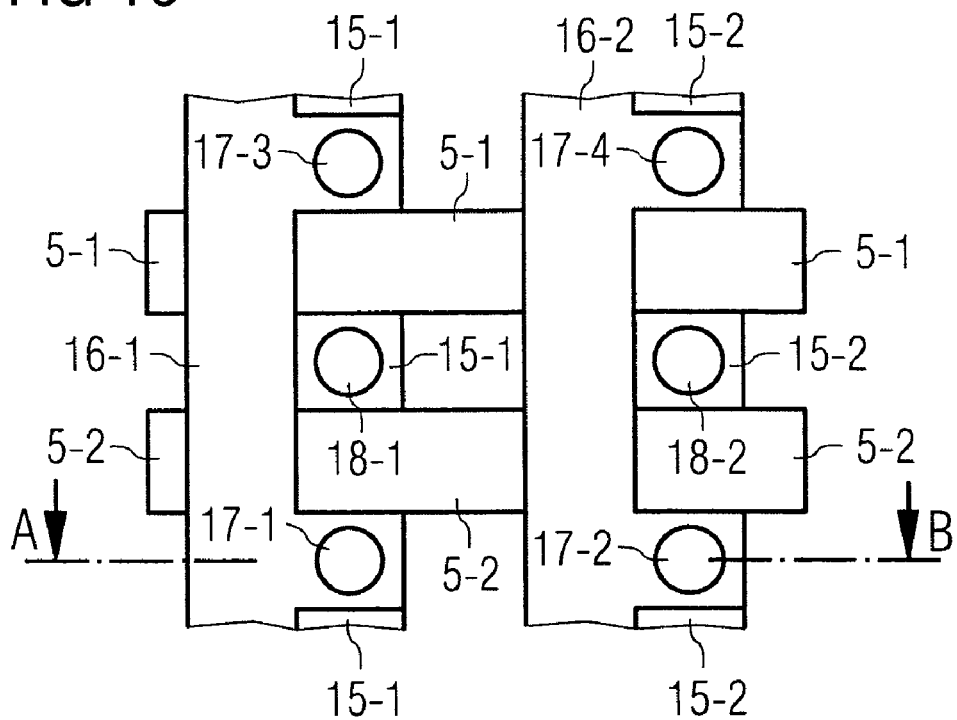
FIG. 19 depicts schematically a semiconductor memory according to one embodiment of the invention.

FIG. 19 shows schematically a semiconductor memory according to one embodiment of the invention. First lines 15-1, 15-2 extend along a first direction and are located in a first wiring layer at a distance from a substrate 1 (not shown in FIG. 19). Conductive plugs 18-1, 18-2 are coupled to the first lines 15-1, 15-2. The conductive plugs 18-1, 18-2 are also coupled to first doping regions 6 disposed in the substrate 1 (not shown in FIG. 19), thereby establishing a conductive connection between the first lines 15-1, 15-2 and the first doping regions 6 disposed in the substrate 1.

Second lines 16-1, 16-2 extend along the first direction in a second wiring layer of the semiconductor memory, wherein the second wiring layer is disposed between the first wiring layer and the substrate 1 (not shown in FIG. 19). Conductive plugs 17-1, 17-2, 17-3, 17-4 are coupled to the second lines 16-1, 16-2. The conductive plugs 17 are also coupled to first doping regions 6 disposed in the substrate 1 (not shown in FIG. 19), thereby establishing a conductive connection between the second lines 16-1, 16-2 and the first doping regions 6 disposed in the substrate 1.

Wordlines 5-1, 5-2 extend along a second direction. Wordlines 5-1, 5-2 are coupled to dielectric layers 4 of memory cells 21 (not shown in FIG. 19).

Figure 20:
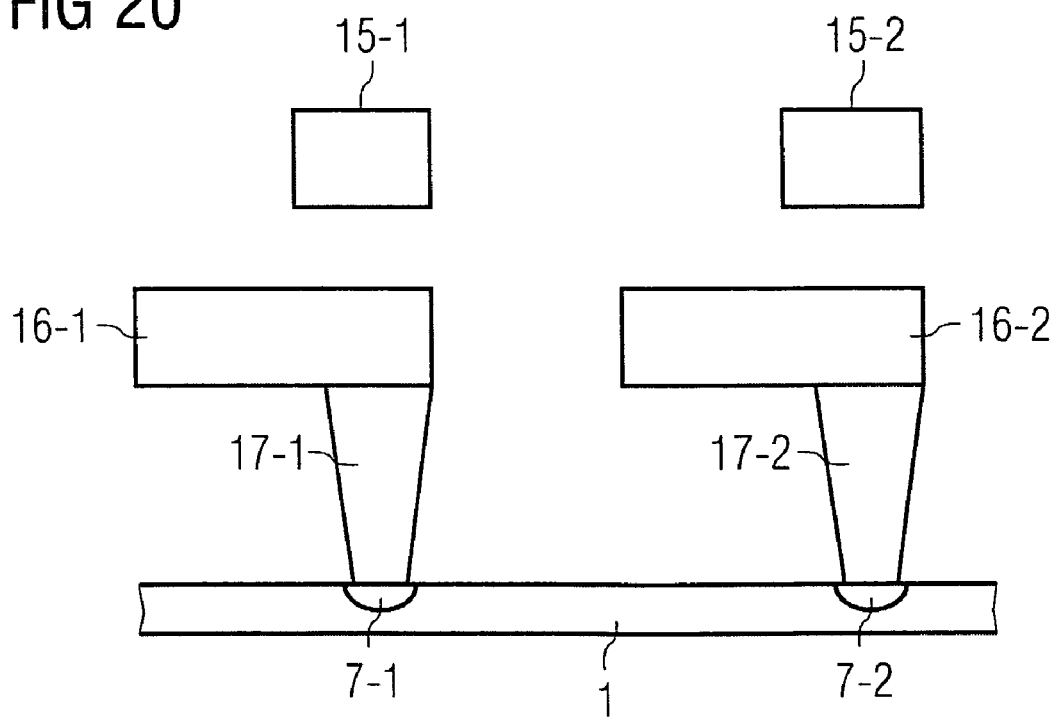
FIG. 20 shows a cross-sectional view along a first plane of the semiconductor memory as depicted in FIG. 19.

FIG. 20 shows a cross sectional view along AB of the semiconductor memory as depicted in FIG. 19. The second doping region 7-1 disposed in the substrate 1 is coupled to the second line 16-1 by the conductive plug 17-1, wherein the second line 16-1 is disposed in the second wiring layer above the top surface of the substrate 1. The first line 15-1 is disposed in a wiring layer located above the layer in which the first line 16-1 is disposed.

It is to be understood, that this invention is not limited to the particular component parts of the devices described or to process steps of the methods described as such devices and methods may vary. It is also to be understood, that different features as described in different embodiments, for example illustrated with different figures, may be combined to new embodiments. It is finally to be understood, that the terminology used herein is for the purposes of describing particular embodiments only and it is not intended to be limiting. It must be noted, that as used in the specification and the appended claims, the singular forms of "a", "an", and "the" include plural referents until the context clearly dictates otherwise.

What is claimed is:

1. A semiconductor memory having a multitude of memory cells, said semiconductor memory having a substrate, at least one wordline and a first and a second line, wherein each memory cell of said multitude of memory cells comprises:
a first doping region disposed in said substrate;
a second doping region disposed in said substrate;
a channel region disposed in said substrate between said first doping region and said second doping region;
a charge-trapping layer stack disposed over said substrate, said charge-trapping layer stack continuously covering said channel region, a portion of said first doping region and a portion of said second doping region;
a conductive layer disposed over said charge-trapping layer stack, wherein said conductive layer is electrically floating; and
a dielectric layer disposed on a top surface of said conductive layer and on sidewalls of said conductive layer;
said first line extending along a first direction and coupled to said first doping region;
said second line extending along said first direction and coupled to said second doping region; and
said at least one wordline extending along a second direction and being disposed over said dielectric layer;
wherein said charge-trapping layer stack is formed as a continuous layer laterally extending beyond said memory cell, said conductive layer disposed on a portion of said charge-trapping layer stack, said portion of said charge-trapping layer stack covering said channel region and said portion of said first doping region and said portion of said second doping region, said dielectric layer being disposed on said top surface and said sidewalls of said conductive layer and on other portions of said charge-trapping layer stack, said other portions being located between conductive layers of memory cells adjacent to one another.

2. The semiconductor memory of claim 1, wherein said dielectric layer extends into recesses between conductive layers of memory cells adjacent to one another.

3. The semiconductor memory of claim 2, wherein said wordline extends into said recesses and covers said dielectric layer in said recesses.

4. The semiconductor memory of claim 3, wherein said charge-trapping layer stack is provided between said wordline and said substrate and wherein said charge-trapping layer stack is in contact with said substrate and said conductive layer and with portions of said dielectric layer located between conductive layers of memory cells adjacent to one another.

5. The semiconductor memory of claim 1, wherein said conductive layer comprises n-doped polysilicon, p-doped polysilicon or a metal.

6. The semiconductor memory of claim 5, wherein said conductive layer comprises at least one material selected from the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr.

7. The semiconductor memory of claim 1, wherein said wordline comprises n-doped polysilicon, p-doped polysilicon or a metal.

8. The semiconductor memory of claim 7, wherein said wordline comprises at least one material selected from the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr.

9. The semiconductor memory of claim 1, wherein said charge-trapping layer stack comprises a material selected from the group consisting of silicon oxide, silicon nitride, hafnium oxide, aluminum oxide and hafnium silicate.

10. The semiconductor memory of claim 1, wherein said charge-trapping layer stack comprises a material having a dielectric constant of at least 3.9.

11. The semiconductor memory of claim 1, wherein said charge-trapping layer stack comprises a first dielectric layer disposed over said substrate, a second dielectric layer disposed on said first dielectric layer and a third dielectric layer disposed on said second dielectric layer.

12. The semiconductor memory of claim 11, wherein said first and third dielectric layers of said charge-trapping layer stack each comprise a material selected from the group consisting of silicon oxide and hafnium silicate, and wherein said second dielectric layer of said charge-trapping layer stack comprises a material selected from the group consisting of silicon nitride, hafnium oxide and aluminum oxide.

13. The semiconductor memory of claim 11, wherein:
said first dielectric layer of said charge-trapping layer stack comprises a material having a dielectric constant of at least 3.9;
said second dielectric layer of said charge-trapping layer stack comprises a material having a dielectric constant of at least 3.9; and
said third dielectric layer of said charge-trapping layer stack comprises a material having a dielectric constant of at least 3.9.

14. The semiconductor memory of claim 13, wherein said first dielectric layer of said charge-trapping layer stack has a thickness of between about 4 nm and about 6 nm.

15. The semiconductor memory of claim 14, wherein said second dielectric layer of said charge-trapping layer stack has a thickness of between about 4 nm and about 6 nm.

16. The semiconductor memory of claim 15, wherein said third dielectric layer of said charge-trapping layer stack has a thickness of between about 5 nm and about 7 nm.

17. The semiconductor memory of claim 1, wherein said dielectric layer comprises a material selected from the group consisting of silicon oxide, silicon nitride, hafnium oxide, aluminum oxide and hafnium silicate.

18. The semiconductor memory of claim 1, wherein said dielectric layer comprises a material having a dielectric constant of at least 3.9.

19. The semiconductor memory of claim 1, wherein said dielectric layer comprises a first dielectric layer in contact with said conductive layer, a second dielectric layer disposed on said first dielectric layer of said dielectric layer and a third dielectric layer disposed on said second dielectric layer of said dielectric layer.

20. The semiconductor memory of claim 19, wherein:
said first dielectric layer of said dielectric layer comprises a material selected from the group consisting of silicon oxide, silicon nitride, hafnium oxide, aluminum oxide and hafnium silicate;
said second dielectric layer of said dielectric layer comprises a material selected from the group consisting of silicon oxide, silicon nitride, hafnium oxide, aluminum oxide and hafnium silicate; and
said third dielectric layer of said dielectric layer comprises a material selected from the group consisting of silicon oxide, silicon nitride, hafnium oxide, aluminum oxide and hafnium silicate.

21. The semiconductor memory of claim 19, wherein:
said first dielectric layer of said dielectric layer comprises a material having a dielectric constant of at least 3.9;
said second dielectric layer of said dielectric layer comprises a material having a dielectric constant of at least 3.9; and
said third dielectric layer of said dielectric layer comprises a material having a dielectric constant of at least 3.9.

22. The semiconductor memory of claim 19, wherein said first dielectric layer of said dielectric layer has a thickness of between about 3 nm and about 5 nm 23. The semiconductor memory of claim 22, wherein said second dielectric layer of said dielectric layer has a thickness of between about 4 nm and about 6 nm.

24. The semiconductor memory of claim 23, wherein said third dielectric layer of said dielectric layer has a thickness of between about 4 nm and about 6 nm.

* * * * *